United States Patent [19]

Yamamoto

[11] 4,377,605

[45] Mar. 22, 1983

[54] METHOD FOR FORMING AN INSULATING LAYER ON A POLYCRYSTALLINE SILICON LAYER OF A SEMICONDUCTOR DEVICE USING A TWO-STEP THERMAL OXIDATION TECHNIQUE

[75] Inventor: Takashi Yamamoto, Yokohama, Japan

[73] Assignee: Fujitsu Limited, Kawasaki, Japan

[21] Appl. No.: 264,815

[22] Filed: May 18, 1981

[30] Foreign Application Priority Data

May 19, 1980 [JP] Japan .................................. 55-65233

[51] Int. Cl.³ ........................................ H01L 21/316
[52] U.S. Cl. ........................................ 427/93; 427/88
[58] Field of Search .................................... 427/93, 88

[56] References Cited

U.S. PATENT DOCUMENTS

| | | | |
|---|---|---|---|
| 4,178,396 | 12/1979 | Okano et al. | 427/93 |
| 4,214,919 | 7/1980 | Young | 427/93 |
| 4,251,571 | 2/1981 | Garbarino | 427/93 |

FOREIGN PATENT DOCUMENTS

| | | | |
|---|---|---|---|
| 2814052 | 10/1979 | Fed. Rep. of Germany | 427/93 |
| 56-9210 | 1/1981 | Japan | 427/93 |

OTHER PUBLICATIONS

Anderson et al., "Evidence for Surface Aspirity Mechanism of Conductivity in Oxide Grown on Polycrystalline Silicon," Journal of Applied Physics, vol. 48, No. 11, Nov. 1977, pp. 4834–4836.

Irene "Method to Reduce Defects in Very Thin $SiO_2$ Films," IBM TDB, vol. 21, No. 1, p. 393, Jun. 1978.

*Primary Examiner*—John D. Smith
*Attorney, Agent, or Firm*—Staas & Halsey

[57] ABSTRACT

When an insulating layer is formed on a polycrystalline silicon layer by thermally oxidizing the polycrystalline silicon layer, ambient gas to be used as an oxidizing gas comprises an oxygen gas and an inert gas. It is preferable that the ratio of oxygen partial pressure of the ambient gas is up to 0.35.

9 Claims, 23 Drawing Figures

METHOD FOR FORMING AN INSULATING LAYER ON A POLYCRYSTALLINE SILICON LAYER OF A SEMICONDUCTOR DEVICE USING A TWO-STEP THERMAL OXIDATION TECHNIQUE

BACKGROUND OF THE INVENTION (1) Field of the Invention

The present invention relates to a semiconductor device, and more particularly to a method for forming an insulating layer on a polycrystalline silicon layer within a semiconductor device.

(2) Description of the Prior Art

In an FAMOS (Floating gate Avalanche injection Metal Oxide Semiconductor) wherein an electrically conductive polycrystalline silicon layer is used as a floating gate, leakage current flowing through an insulating oxide layer which is formed on the polycrystalline silicon layer by thermally oxidizing the polycrystalline silicon, should be as small as possible. In the case of a dynamic RAM (Random Access Memory) or a CCD (Charge Coupled Device) having a two-layer structure of polycrystalline silicon, an insulating oxide layer lies between the two-layers of polycrystalline silicon and is formed by thermally oxidizing the lower polycrystalline silicon layer of the two-layers. Leakage current flowing through the insulating layer should be as small as possible. It is possible to evaluate the resistance of the insulating oxide layer to the leakage current by adopting the breakdown property of the insulating oxide layer. The insulating oxide layer having a breakdown voltage of more than 5 MV/cm can be practically used.

A process for forming an insulating oxide layer having a high breakdown voltage on a polycrystalline silicon layer, which has been heretofore considered to be most preferable, is to thermally oxidize the polycrystalline silicon in a dry oxygen atmosphere at a high temperature of approximately 1200° C. Recently, a monocrystalline silicon wafer having a large diameter of 4 inches or more, has become available, and simultaneous treatment of a plurality of silicon wafers has been tried in order to increase the productivity and to reduce the production cost. However, when a polycrystalline silicon layer, laying on a large silicon wafer having a diameter of 4 inches or more, is thermally oxidized to form an insulating oxide layer in accordance with a conventional oxidation procedure, warp is often generated in the silicon wafer and the thickness of the formed insulating oxide layer is not uniform. The conventional oxidation procedure comprises the steps of: placing a plurality of wafers provided with a polycrystalline silicon layer in a heating furnace having a temperature of from 1050° to 1200° C.; oxidizing the upper part of the polycrystalline silicon layer in an atmosphere comprising dry oxygen gas and hydrogen chloride gas (anhydrous hydrochloric acid gas) to form an insulating oxide (silicon dioxide) layer having a predetermined thickness; slow cooling the oxidation-treated wafers; and withdrawing the resultant wafer from the heating furnace. In a case where the polycrystalline silicon is oxidized at a temperature of up to 1100° C., the formed insulating oxide layer has an insufficient breakdown voltage of 3 MV/cm or less. In a case where the polycrystalline silicon is oxidized at 1200° C., the formed insulating oxide layer has a sufficient breakdown voltage of 5 MV/cm or more, but it is difficult to form exactly a thin insulating oxide layer having a predetermined thickness of several hundred angstroms, because the oxidizing rate is large as the oxidation temperature rises.

SUMMARY OF THE INVENTION

An object of the present invention is to provide a method for forming an insulating layer having a breakdown voltage of 5 MV/cm or more on a polycrystalline silicon layer within a semiconductor device by thermal oxidation at a temperature of 1050° C. or more.

Another object of the present invention is to provide a method for thermally oxidizing polycrystalline silicon, whereby the insulating oxide layer can be formed with a good reproducibility in respect to the thickness thereof.

Still another object of the present invention is to provide a method for oxidizing a polycrystalline silicon layer deposited on a silicon wafer without the occurrence of warp in the wafer.

In accordance with the present invention, the above-mentioned objects are attained by a method for forming an insulating layer on a polycrystalline layer within a semiconductor device, which method comprises the step of thermally oxidizing the upper part of the polycrystalline silicon layer in a gas mixture of an oxidizing gas and an inert gas to form the insulating layer.

DESCRIPTION OF THE PREFERRED EMBODIMENTS

In order to measure the breakdown voltage of an insulating layer formed on a polycrystalline silicon layer by thermally oxidizing the upper part of the polycrystalline silicon layer, semiconductor device samples, provided with the insulating layer, are produced in the following manner.

Figure 1A:
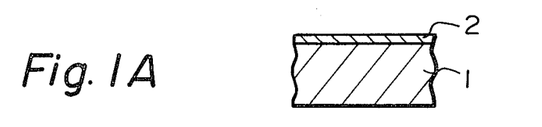
FIGS. 1A through 1E are schematic sectional views of a semiconductor device sample in intermediate stages of production.
Figure 1B:
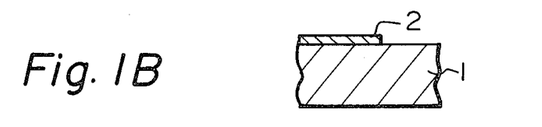
Figure 1C:
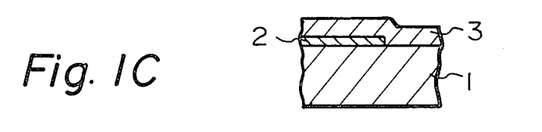
Figure 1D:
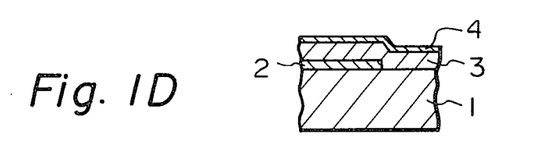
Figure 1E:
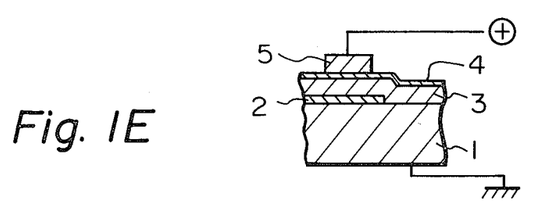

Firstly, a starting material is a monocrystalline silicon wafer (n-type, 10~20 ohm·cm, 4 inches in diameter) 1 in FIG. 1A. A silicon dioxide layer 2 having a thickness of approximately 200 nm (2000 Å) is formed on the silicon wafer 1 by a conventional thermal oxidation process. Then, the silicon dioxide layer 2 is selectively etched by a conventional photoetching process, as illustrated in FIG. 1B. A phosphorus doped polycrystalline silicon layer 3 having a thickness of approximately 400 nm is deposited on the wafer 1 and the silicon dioxide layer 2 by a conventional chemical vapor deposition (CVD) process, as illustrated in FIG. 1C. The upper part of the polycrystalline silicon layer 3 is thermally oxidized under various conditions, which are explained hereinafter, to form an insulating layer 4 of silicon dioxide on the polycrystalline silicon layer 3, as illustrated in FIG. 1D. Then, another phosphorus doped polycrystalline silicon layer 5 having a thickness of approximately 400 nm is deposited on the insulating layer 4 by a conventional CVD process and is selectively etched by a photoetching process to form a large number of electrodes 5 of polycrystalline silicon, as illustrated in FIG. 1E. The dimensions of each electrode 5 are 3.2 mm by 5.5 mm. When the silicon wafer 1 is grounded and positive voltage is applied to each of the polycrystalline silicon electrodes 5, namely when the insulating layer 4 is applied with a voltage, the leakage current flowing through the insulating layer 4 is measured. When the leakage current (I) reaches 1 μA, the applied voltage value (V) is herein regarded as the breakdown voltage of the insulating layer.

Thermal oxidizing conditions of the polycrystalline silicon layer 3 are shown in Table 1.

are selected from a large number of the electrodes at random and tested to measure the breakdown voltage value thereof, in each of Samples A through I. The obtained results are shown in FIGS. 2A, 3A, 4A, 5A, 6A and 7A. FIGS. 2A through 7A are histograms and indicate the breakdown voltages of the samples A through F in Table 1, respectively. In each of the histograms the ordinate indicates the percentage of the insulating layers having a certain breakdown voltage, and the abscissa indicates the breakdown voltage.

From the obtained results in the case of Samples A, B and C (in Table 1, i.e. shown in FIGS. 2A, 3A and 4A, respectively), the average value of breakdown voltage measurements, except extremely low measured values, can be determined by calculation. The obtained average values of breakdown voltage are indicated by circles A, B and C in FIG. 8, respectively. In order to clarify the relationship between the oxygen partial pressure and breakdown voltage, it is possible to draw a line α with respect to the average values, as illustrated in FIG. 8.

Figure 2A:
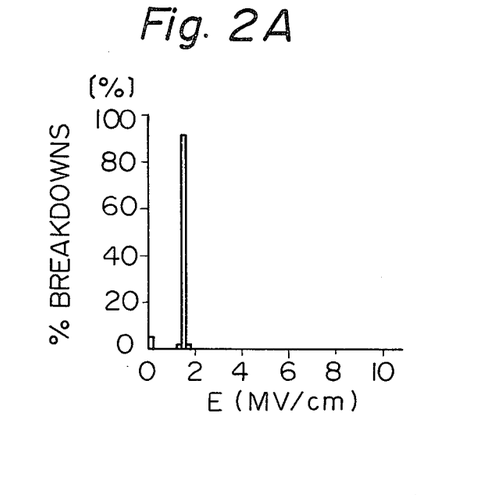
FIGS. 2A, 3A and 4A are histograms showing the relationship between percentage of breakdown number and breakdown voltage of insulating layers which are formed on polycrystalline silicon layers at 1050° C.
Figure 3A:
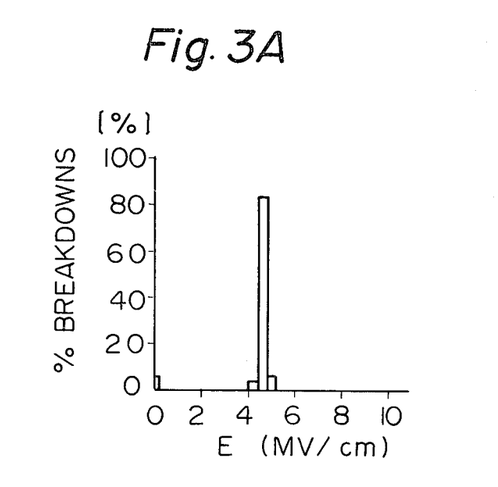
Figure 4A:
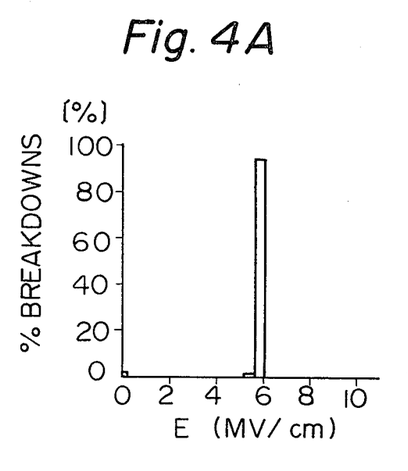
Figure 8:
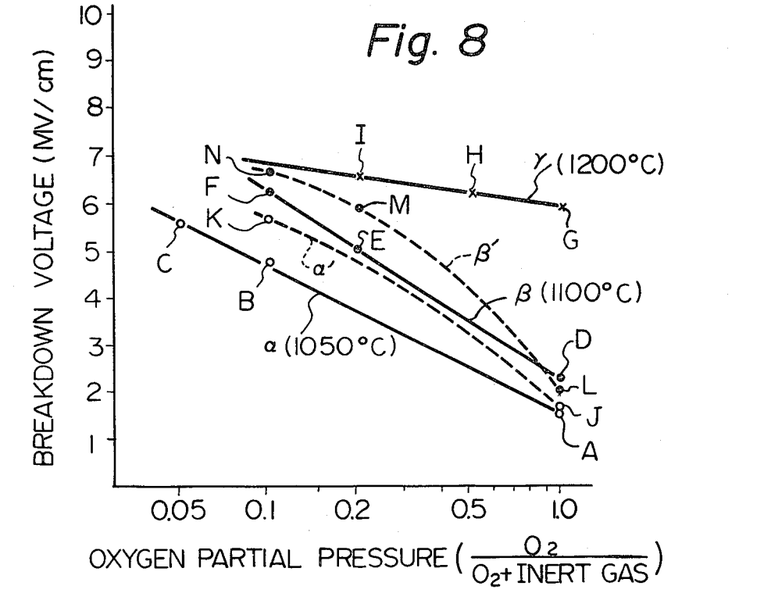
FIG. 8 is a diagram showing the relationship between partial pressure ratio of oxygen gas and breakdown voltage of insulating layer formed by thermally oxidizing polycrystalline silicon at 1050° C., 1100° C. and 1200° C., respectively.

As is obvious from FIGS. 2A, 3A and 4A and the line α in FIG. 8, as the oxygen partial pressure decreases, the breakdown voltage of the insulating layer of silicon dioxide formed by thermally oxidizing the polycrystalline silicon layer increases from approximately 1.5 MV/cm (in Sample A in which the ambient gas does not contain the inert gas) to approximately 5.8 MV/cm (in Sample C).

From the obtained results in the case of Samples D, E

TABLE 1

| | THERMAL OXIDATION CONDITION | | | | | Thickness of | |
|---|---|---|---|---|---|---|---|
| | Ambient Gas | | | Heating Condition | | Insulating Layer (nm) | |
| | Oxygen Gas | | HCl Gas | | | | |
| Sample | Partial Pressure $\frac{O_2}{O_2 + \text{Inert Gas}}$ | Inert Gas | $\frac{HCl}{O_2} \times 100$ (Vol. %) | Temperature (°C) | Time (min.) | On Poly Crystalline | On Single Crystalline |
| A | 1.0 | — | 1.25 | 1050 | 20 | 63 | 48.5 |
| B | 0.1 | Ar | 5.0 | 1050 | 80 | 54 | 44 |
| C | 0.05 | Ar | 5.0 | 1050 | 120 | 50.5 | 39 |
| D | 1.0 | — | 1.25 | 1100 | 12.5 | 64 | 50.5 |
| E | 0.2 | Ar | 5.0 | 1100 | 21 | 50 | 41 |
| F | 0.1 | Ar | 5.0 | 1100 | 50 | 53 | 45 |
| G | 1.0 | — | 1.25 | 1200 | 15 | 101.0 | 94 |
| H | 0.5 | Ar | 5.0 | 1200 | 24 | 115.5 | 103 |
| I | 0.2 | Ar | 5.0 | 1200 | 32 | 99.0 | 94 |

A plurality of the above-mentioned wafers (fifty wafers) provided with the polycrystalline silicon layer are arranged in a boat and inserted into a heating furnace maintained at a predetermined temperature. The wafers are heated for a suitable period in the ambient gas including an oxidizing gas (oxygen). The ambient gas has atmospheric pressure and consists of an inert gas (e.g. argon gas), oxygen gas and hydrogen chloride gas according to the present invention, or consists of a oxygen gas and hydrogen chloride (HCl) gas according to the prior art. The addition of HCl gas into the oxygen (O₂) gas is often carried out so as to increase the surface passivation effect against sodium ions. Thus, the upper part of the polycrystalline silicon layer 3 is thermally oxidized to now the insulating layer 4 of silicon dioxide having a thickness as shown in Table 1. After the oxidation treatment, flow of the oxygen gas and HCl gas is stopped, so that the ambient gas consists of an inert gas only. Simultaneously, the boat having the wafers is gradually withdrawn from the furnace. In order to measure the breakdown voltage of the formed insulating layer, the above-mentioned polycrystalline silicon electrodes are formed. Approximately 100 electrodes and F (in Table 1, i.e. shown in FIGS. 5A, 6A and 7A, respectively), the average value of breakdown voltage measurements, except extremely low measured values, can be determined by calculation. The average values of breakdown voltage are indicated by black circles D, E and F in FIG. 8, respectively. It is also possible to draw a line β with respect to the average values, as illustrated in FIG. 8. As is obvious from FIGS. 5A, 6A and 7A and the line β in FIG. 8, as the oxygen partial pressure decreases, the breakdown voltage of the insulating oxide layer increases from approximately 2.2 MV/cm (in Sample D) to approximately 6.4 MV/cm (in Sample F).

In the case of Samples G, H and I in Table 1, a breakdown voltage distribution of all measurement values is not shown, but an average value of the measurements, except extremely low measured values, can be determined by calculation. The obtained average values of breakdown voltage are indicated by crosses G, H and I in FIG. 8, respectively. It is also possible to draw a line γ with respect to the average values, as illustrated in FIG. 8. As is obvious from the line γ in FIG. 8, all average values of breakdown voltage are above 5 MV/cm and the lower the oxygen partial pressure is, the higher the breakdown voltage of the insulating layer is.

As is evident from FIG. 8, in a case where the oxygen partial pressure is prescribed, the higher the oxidizing temperature (i.e. heating temperature) is, the higher the breakdown voltage of the insulating layer can be made. In order to make the breakdown voltage of the insulating layer, formed on the polycrystalline silicon layer, above 5 MV/cm, in case of a heating (oxidizing) temperature of 1050° C., it is preferable to make the oxygen partial pressure ratio in the ambient gas up to 0.08. In case of a heating temperature of 1100° C.; it is preferable to make the oxygen partial pressure ratio up to 0.21. However, as is evident from Table 1, the lower the through 7B are histograms similar to FIGS. 2A through 7A, and the thermal oxidation conditions for FIGS. 2B through 7B are the same as those for FIGS. 2A through 7A, respectively.

Figure 2B:
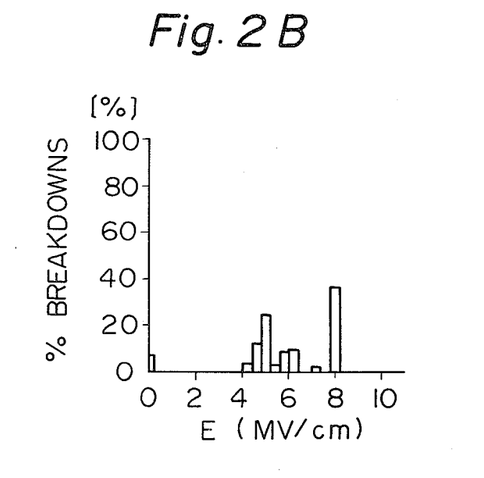
FIGS. 2B, 3B and 4B are histograms showing the relationship between percentage of breakdown number and breakdown voltage of insulating layers which are formed on monocrystalline silicon wafers at 1050° C.
Figure 3B:
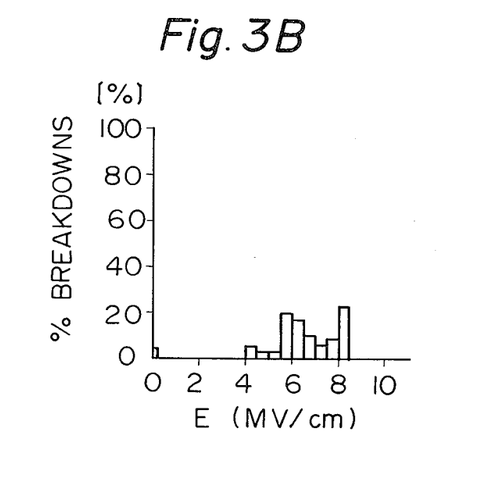
Figure 4B:
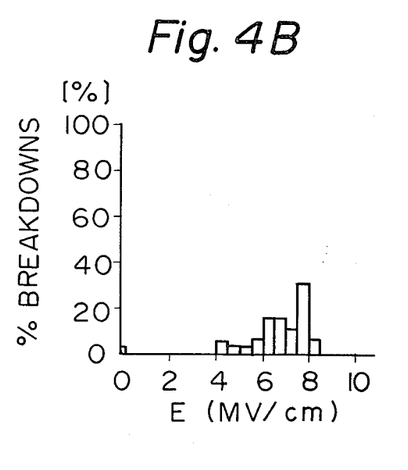
Figure 5A:
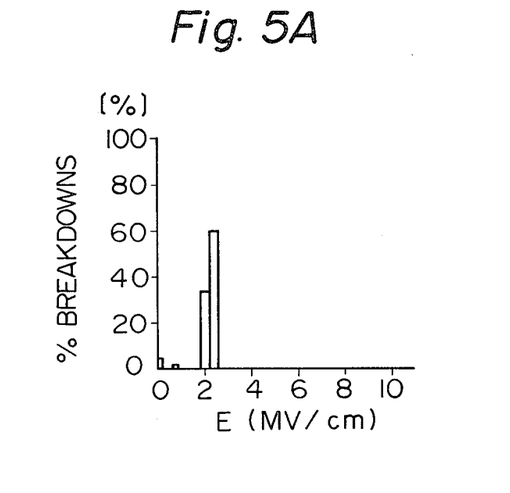
FIGS. 5A, 6A and 7A are histograms, similar to FIG. 2A, of insulating layers which are formed at 1100° C.
Figure 5B:
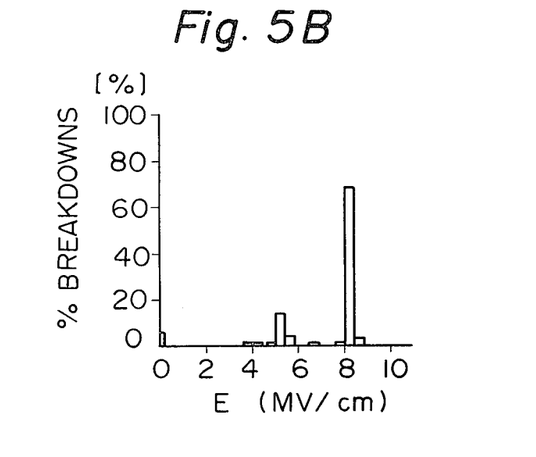
FIGS. 5B, 6B and 7B are histograms, similar to FIG. 2B, of insulating layers which are formed at 1100° C.
Figure 6A:
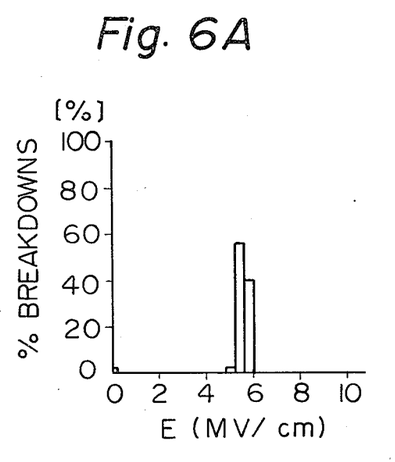
Figure 6B:
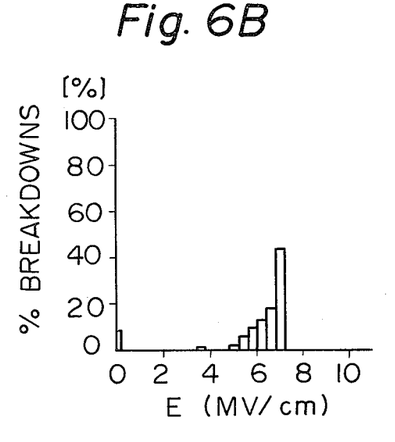
Figure 7A:
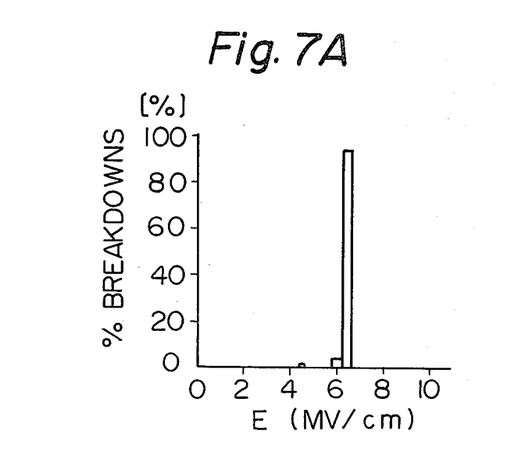
Figure 7B:
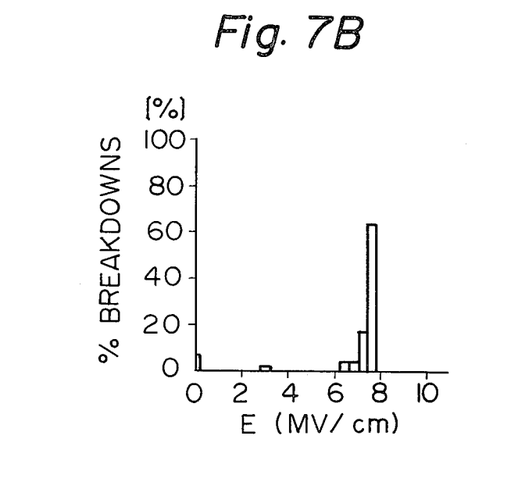

As can been seen in FIGS. 2B, 3B and 4B, the breakdown distribution of the insulating oxide layer formed on the monocrystalline silicon is not improved, though the oxygen partial pressure decreases. In a case where the insulating layer is formed by thermally oxidizing the monocrystalline silicon wafer at 1100° C., as can be seen in FIGS. 5B, 6B and 7B, as the oxygen partial pressure decreases, the breakdown distribution of the insulating layer is slightly improved.

Furthermore, the above-mentioned polycrystalline silicon layer, lying on the silicon dioxide layer and silicon wafer, is thermally oxidized in accordance with the thermal oxidizing conditions shown in Table 2.

TABLE 2

| | THERMAL OXIDATION CONDITION | | | | | | | Thickness of Insulating Layer (nm) |
|---|---|---|---|---|---|---|---|---|
| | Ambient Gas | | | Heating Condition | | | | |
| | Oxygen Gas | | HCl Gas | First Step | | Second Step | | |
| Sample | Partial Pressure $\frac{O_2}{O_2 + \text{Inert Gas}}$ | Inert Gas | $\frac{HCl}{O_2} \times 100$ (vol. %) | Temp. (°C.) | Time (min.) | Temp. (°C.) | Time (min.) | |
| J | 1.0 | — | 1.25 | 950 | 7 | 1050 | 7 | 51 |
| K | 0.1 | Ar | 5.0 | 950 | 7 | 1050 | 70 | 56.5 |
| L | 1.0 | — | 1.25 | 950 | 7 | 1100 | 1 | 52 |
| M | 0.2 | Ar | 5.0 | 950 | 7 | 1100 | 13 | 53.5 |
| N | 0.1 | Ar | 5.0 | 950 | 7 | 1100 | 33 | 50.5 |
| O | 1.0 | — | 1.25 | 950 | 7 | 1200 | 4 | 94.0 |
| P | 0.5 | Ar | 1.25 | 950 | 7 | 1200 | 16 | 103.0 |
| Q | 0.2 | Ar | 5.0 | 950 | 7 | 1200 | 32 | 94.0 | oxidizing temperature is, the smaller the oxidation (formation) rate is for forming the insulating oxide layer. Therefore, in order to form the insulating layer having a predetermined thickness, the oxidizing period becomes longer. However, it is not desirable to make the oxidizing period too long. While in the case of a heating temperature of 1200° C., a decrease of the oxygen partial pressure can form a thin insulating layer having a predetermined thickness.

As comparative examples, an insulating layer of silicon dioxide is formed on a monocrystalline silicon wafer by thermal oxidation and then the breakdown property of the formed insulating layer is appraised.

The above-mentioned insulating layer is formed in the following manner. A monocrystalline silicon wafer (n-type, 10~20 ohm·cm, 4 inches diameter, not shown) is set on the hereinbefore mentioned boat together with the wafers provided with a polycrystalline silicon layer (as illustrated in FIG. 1C). The boat is inserted into the heating furnace and maintained at a predetermined temperature. The thermal oxidation condition for the monocrystalline wafer is the same as that for polycrystalline silicon layer shown in Table 1. After the thermal oxidation, the phosphorus doped polycrystalline silicon layer is deposited on the formed insulating oxide layer and is selectively etched to form a large number of electrodes of polycrystalline silicon in the above-mentioned manner. The dimension of each electrode are 3.2 mm by 5.5 mm. When the silicon wafer is grounded and positive voltage is applied to each of the electrodes, the leakage current flowing through the formed insulating layer is measured. Therefore, the leakage current for approximately 100 electrodes selected randomly from a large number of the electrodes is measured to define the breakdown voltage thereof. The obtained results are shown in FIGS. 2B, 3B, 4B, 5B, 6B and 7B. FIGS. 2B A plurality of the wafers (fifty wafers) provided with the polycrystalline silicon layer are arranged in a boat and inserted into a heating furnace having a temperature of 950° C. The wafers are heated (i.e. thermally oxidized) at 950° C. for a period of 7 minutes in an ambient gas including an oxygen gas (in a first step of heating condition). The ambient gas has atmospheric pressure and consists of oxygen gas, an inert gas (argon gas) and hydrogen chloride gas according to the present invention (in cases of Samples K, M, N, P and Q), or consists of oxygen gas and hydrogen chloride gas according to the prior art (in cases of Samples J, L and O). Then, the heating temperature of the furnace is raised to 1050° C., 1100° C. or 1200° C. at a predetermined heating rate of 10° C./min. By keeping the furnace at 1050° C., 1100° C. or 1200° C. for a suitable period (in a second step of heating condition), the polycrystalline silicon layer is further oxidized in the ambient gas to form an insulating oxide layer having a prdetermined thickness. The ambient gas containing the oxygen gas flows during the oxidation period and then is changed to another ambient gas consisting of inert gas (argon gas) only. While passing the inert ambient gas, the temperature of the furnace is reduced at a cooling rate of 4° C./min to 950° C. Then, the wafers provided with the formed insulating layer are withdrawn from the heating furnace. Another polycrystalline silicon layer having a thickness of approximately 400 nm is deposited on the insulating layer and is selectively etched to form a large number of electrodes. The dimensions of each electrode are 3.2 mm by 5.5 mm. In order to measure the breakdown voltage of the insulating layer, the wafer is grounded and positive voltage is applied to each of the electrodes, so that the leakage current flowing through the insulating layer can be measured. Based on the measured leakage current value, the breakdown voltage of the insulating layer is determined. Approximately 100 electrodes are randomly selected from a large number of the electrodes and are tested to determine the breakdown voltage in each sample J through N. The obtained results are shown in FIGS. 9 through 13 which are histograms similar to FIG. 2A.

Figure 9:
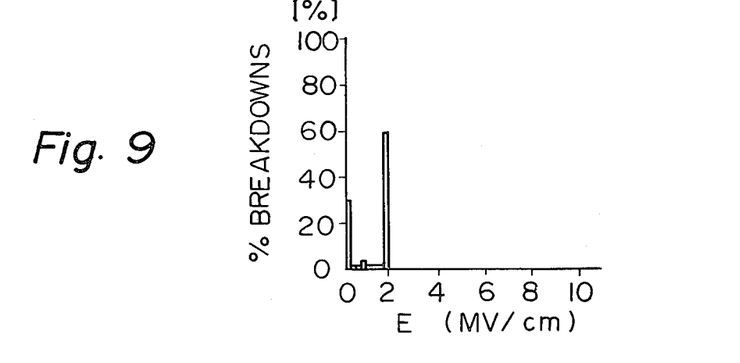
FIGS. 9 and 10 are histograms, similar to FIG. 2A, of insulating layers which are formed by two-step thermal oxidation at 1050° C.
Figure 10:
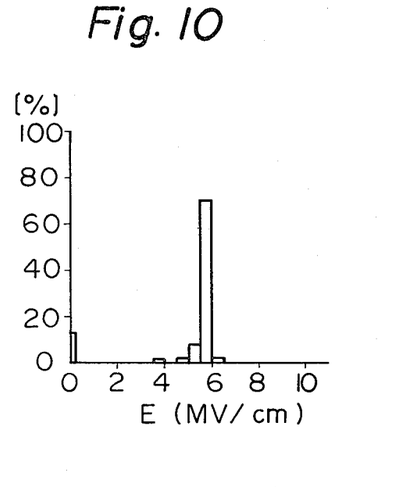

As is obvious from FIGS. 9 and 10 which indicate cases of Sample J and Sample K in Table 2, respectively, the breakdown distribution of the insulating layer in Sample K (FIG. 10) is preferable to that of Sample J (FIG. 9) and the average value of breakdown voltage of the insulating layer in Sample K is larger than that of Sample J. The obtained average values of breakdown voltage are indicated by circles J and K and a broken line $\alpha'$ in FIG. 8. When the oxygen partial pressure of the ambient gas is low, breakdown property of the insulating layer formed on the polycrystalline silicon layer is superior.

Figure 11:
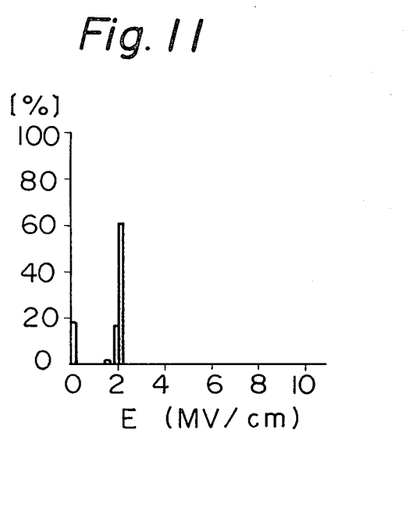
FIGS. 11, 12 and 13 are histograms, similar to FIG. 2A, of insulating layers which are formed by two-step thermal oxidation at 1100° C.
Figure 12:
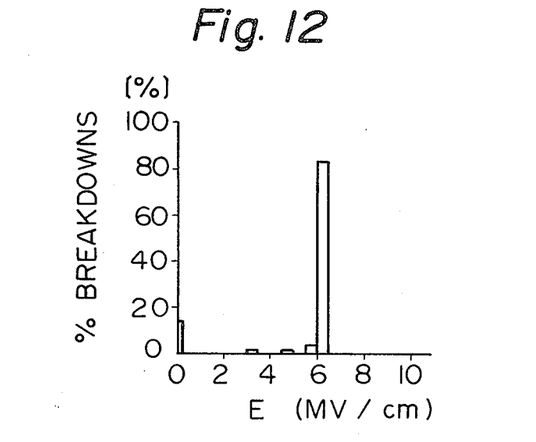
Figure 13:
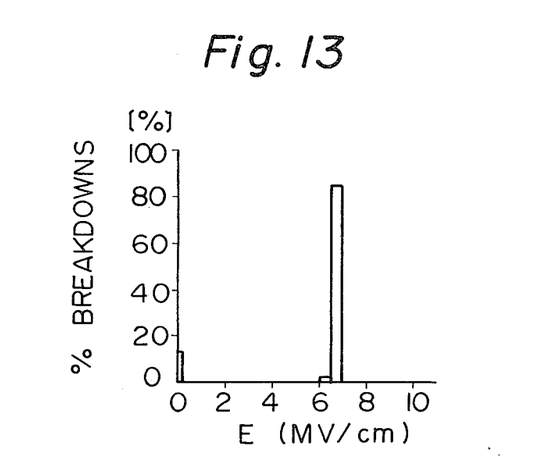

As is obvious from FIG. 11 (Sample L in Table 2), FIG. 12 (Sample M) and FIG. 13 (Sample N), as the oxygen partial pressure decreases, the breakdown voltage of the insulating layer of silicon dioxide increases from approximately 2.1 MV/cm (in Sample L) to approximately 6.8 MV/cm (in Sample N). The obtained average values of breakdown voltage are indicated by black circles L, M and N and a broken line $\beta'$ in FIG. 8.

In order to make the breakdown voltage of the insulating layer formed on the polycrystalline layer above 5 MV/cm, for a heating temperature at 1050° C. it is preferable to make the oxygen partial pressure ratio in the ambient gas up to 0.18 from the broken line $\alpha'$ in FIG. 8, and in case of a heating temperature at 1100° C. it is preferable to make the oxygen partial pressure ratio up to 0.35 from the broken line $\beta'$ in FIG. 8. By comparing the line $\alpha$ and $\beta$ with the line $\alpha'$ and $\beta'$ in FIG. 8 and by comparing FIGS. 2A and 3A with FIGS. 9 and 10, as well as, FIGS. 5A, 6A and 7A with FIGS. 11, 12 and 13, it is seen that the two step thermal oxidation in a gas mixture of oxygen gas and an inert gas is preferable to the one step thermal oxidation.

It is possible to prevent warp and slip-line of crystalline dislocation in the silicon wafer from occurring by carrying out the two step thermal oxidation. Now in each case of Sample O, P and Q in Table 2, a breakdown voltage distribution of all measurement values is not shown. The obtained average values of breakdown voltage of Sample O, P and Q were approximately the same as to the values of Sample G, H and I in Table 1, respectively.

It will be obvious that the present invention is not restricted to the samples described and that many variations are possible for those skilled in the art without departing from the scope of the present invention. For example, it is possible to use an inert gas of He, Ne, Xe or Kr instead of argon gas. The polycrystalline silicon layer may be oxidized thoroughly.

I claim:

1. A method for forming an insulating layer on a polycrystalline silicon layer in a semiconductor device, comprising the steps of:
    a. heating the polycrystalline silicon layer at a first temperature in an ambient gas, including an oxidizing gas comprising oxygen and an inert gas, for a first predetermined period of time to effect initial oxidation of the polycrystalline silicon layer;
    b. heating the polycrystalline silicon layer at a second temperature which is greater than the first temperature, in the ambient gas for a second predetermined period of time to further oxidize the polycrystalline silicon layer, so that the insulating layer is formed; and
    c. cooling the formed insulating layer to the first temperature in the inert gas.

2. A method according to claim 1, wherein the first temperature is less than or equal to 950° C. and wherein the second temperature is less than or equal to 1050° C.

3. A method according to claim 2, wherein the oxygen partial pressure ratio of the ambient gas is less than or equal to 0.18.

4. A method for forming an insulating layer on a polycrystalline silicon layer within a semiconductor device, comprising the steps of:
    a. heating the polycrystalline silicon layer at a temperature less than or equal to 950° C. in a gas mixture, comprising an oxygen gas and an inert gas, for a first predetermined period of time to effect initial oxidation of the polycrystalline silicon layer; and
    b. heating the polycrystalline silicon layer at a temperature of from 1050° C. to 1200° C. in the gas mixture for a second predetermined period of time to further oxidize the polycrystalline silicon layer, so that an insulating layer of silicon dioxide having a breakdown voltage greater than or equal to 5 MV/cm is formed.

5. A method according to claim 4, wherein said inert gas is one of Ar, He, Ne, Xe and Kr.

6. A method according to claim 4, wherein said oxidizing gas contains 1 to 5 vol.% of hydrogen chloride gas to the oxygen gas volume.

7. A method according to claim 4, wherein the ratio of the partial pressure of said oxygen gas to the total pressure of said gas mixture is less than or equal to 0.35 when the temperature of said heating step b is 1100° C.

8. A method according to claim 4, wherein the oxygen partial pressure ratio of the gas mixture is less than or equal to 0.18 when the temperature of said heating step b is 1050° C.

9. A method according to claim 4, further comprising the step of cooling the formed insulating layer to a temperature less than or equal to 950° C. in the inert gas.

* * * * *

UNITED STATES PATENT AND TRADEMARK OFFICE
CERTIFICATE OF CORRECTION

PATENT NO. : 4,377,605
DATED : MARCH 22, 1983
INVENTOR(S) : TAKASHI YAMAMOTO

It is certified that error appears in the above-identified patent and that said Letters Patent is hereby corrected as shown below:

Front page, [56] References Cited, "Garbarino" should be --Garbarino et al.--;
Front page, [57] ABSTRACT, line 4, delete "an" (first occurrence).

Col. 1, line 40, after "wafer" insert --,--.
Col. 2, line 65, "Firstly" should be --First--.
Col. 3, line 54, delete "a";
line 60, "now" should be --grow--.
Col. 5, line 60, "dimension" should be --dimensions--.
Col. 6, line 53, "prdetermined" should be --predetermined--.
Col. 7, line 31, "at" should be --of--;
line 50, delete "to".

Signed and Sealed this

Twenty-sixth Day of July 1983.

[SEAL]

Attest:

GERALD J. MOSSINGHOFF

Attesting Officer

Commissioner of Patents and Trademarks